US008481369B2

(12) United States Patent  
Luo et al.

(10) Patent No.: US 8,481,369 B2
(45) Date of Patent: Jul. 9, 2013

(54) METHOD OF MAKING SEMICONDUCTOR PACKAGE WITH IMPROVED STANDOFF

(75) Inventors: Junhua Luo, Tianjin (CN); Xingshou Pang, Tianjin (CN); Jinzhong Yao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 6 days.

(21) Appl. No.: 13/004,028

(22) Filed: Jan. 11, 2011

(65) Prior Publication Data

US 2011/0189823 A1 Aug. 4, 2011

(30) Foreign Application Priority Data

Feb. 4, 2010 (CN) .......................... 2010 1 0141754

(51) Int. Cl.
*H01L 21/56* (2006.01)
(52) U.S. Cl.
USPC ............ 438/118; 438/127; 257/730; 257/787
(58) Field of Classification Search
CPC ............ H01L 21/50; H01L 21/56; H01L 21/60
USPC .................. 438/113, 107, 460, 112, 123, 124
See application file for complete search history.

(56) References Cited

U.S. PATENT DOCUMENTS

| 6,489,218 | B1 * | 12/2002 | Kim et al. ..................... 438/460 |
| 7,172,927 | B2 | 2/2007 | Yuan |
| 7,351,612 | B2 * | 4/2008 | Gai ............................. 438/117 |
| 7,405,106 | B2 | 7/2008 | Maloney |
| 8,377,750 | B2 * | 2/2013 | Camacho et al. ............. 438/123 |
| 2009/0146269 | A1 * | 6/2009 | Chow et al. .................. 257/659 |
| 2009/0236713 | A1 * | 9/2009 | Xu et al. ....................... 257/676 |
| 2010/0224970 | A1 * | 9/2010 | Powell et al. ................. 257/676 |
| 2012/0280408 | A1 * | 11/2012 | Do et al. ....................... 257/782 |

FOREIGN PATENT DOCUMENTS

JP 2001-185567 6/2001

OTHER PUBLICATIONS

QFN Layout Guidelines, Screaming Circuits (www.screamingcircuits.com), Dec. 11, 2006.

* cited by examiner

*Primary Examiner* — Olik Chaudhuri
*Assistant Examiner* — Wilner Jean Baptiste
(74) *Attorney, Agent, or Firm* — Charles Bergere

(57) ABSTRACT

A no-lead type semiconductor package is formed by attaching a die to a top surface of a flag of a lead frame and then taping a bottom surface of the flag and leads of the lead frame. Die bonding pads are connected to the leads with wires and then the assembly is put in a mold chase and encapsulated with a plastic material. The mold chase has protrusions between the flag and the leads of a lead frame, and between the leads themselves, which causes indentations to be formed between the leads and between the flag and the leads. The method is particularly useful for making quad flat no lead (QFN) devices and power-QFN type devices.

10 Claims, 3 Drawing Sheets

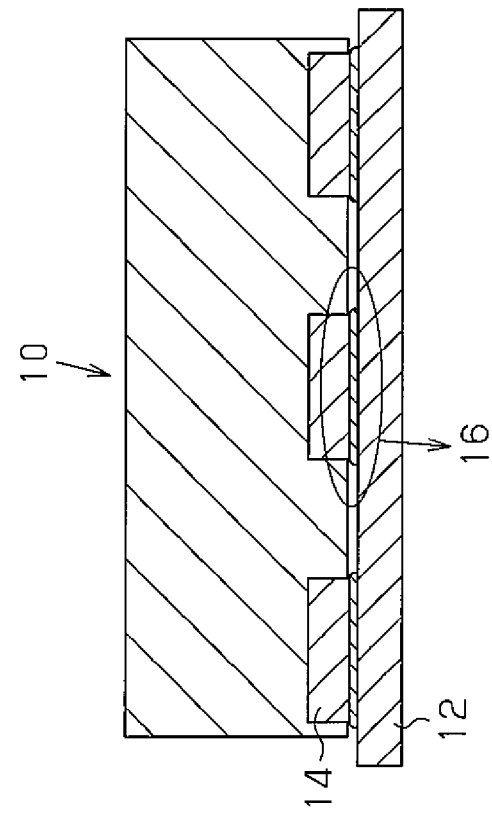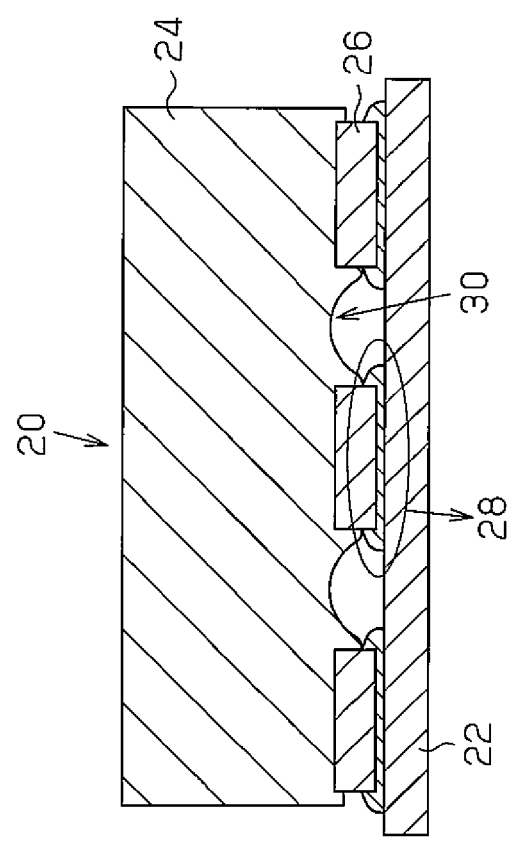

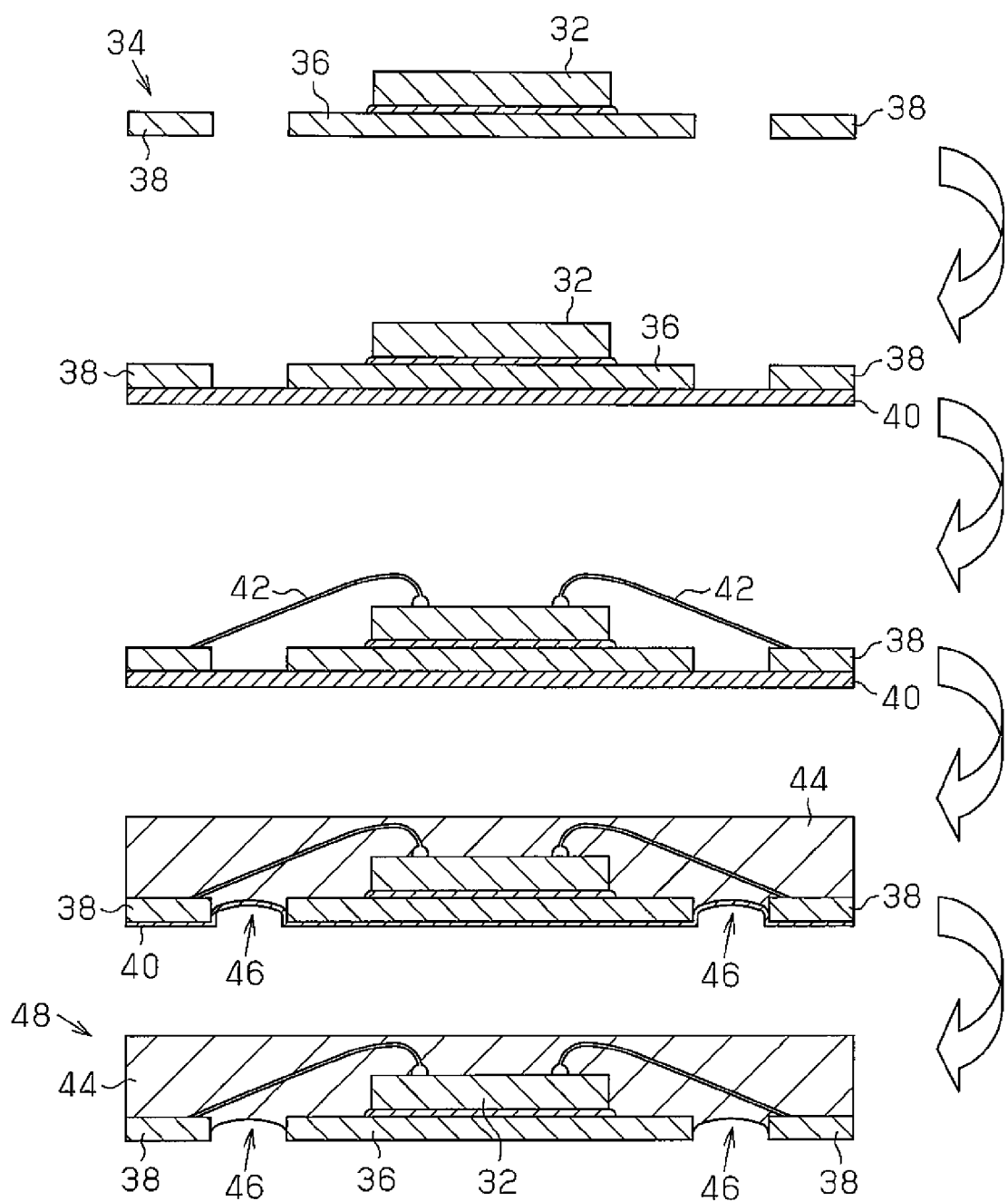

US 8,481,369 B2

METHOD OF MAKING SEMICONDUCTOR PACKAGE WITH IMPROVED STANDOFF

BACKGROUND OF THE INVENTION

The present invention relates to semiconductor packaging and, more particularly, to a method of making a semiconductor package with improved standoff.

Semiconductor dies include integrated circuits formed in Silicon that are usually packaged before being connected to other electronic devices or circuits. Such packaging usually entails attaching the die to a lead frame or substrate and then encapsulating the die and electrical connections with a mold compound. There are many types of packages available, some with leads extending out of the sides of the mold compound and others with an array of pads or conductive balls on a bottom surface of the package.

It is desirable to decrease the size and profile of a semiconductor package. Thin devices are known as low profile packages. One known low profile package is called a QFN (Quad Flat No lead). In a QFN type package, leads of the package are exposed at the sides and/or bottom surface of the package, with the leads being generally flush with the mold compound. Thus, attaching a QFN device to a substrate or Printed Circuit Board (PCB) can be difficult due to its low stand-off height. The stand-off height refers to the distance between the PCB and the semiconductor device.

FIG. 1 shows a conventional QFN device 10 attached to a PCB 12. The QFN device 10 may be attached to the PCB 12 with a solder reflow process. In reflow soldering, the QFN device 10 is attached to the PCB 12 with a solder paste and then subjected to heat, such as via a reflow oven, which melts the solder, thereby connecting the device 10 to the PCB 12, more specifically, connecting exposed leads 14 of the device 10 to corresponding connection points on the PCB 12, at a solder joint 16. As is apparent in FIG. 1, there is a very low stand-off height between the device 10 and the PCB 12. A low stand-off height may increase the level of stress at the solder joints 16 due to the differences in the coefficients of thermal expansion (CTE) of the die and the PCB, which means some of the solder joints 16 may be very weak. Additionally, the low stand-off height makes inserting an underfill material (not shown) between the device 10 and PCB 12 more difficult because many underfill materials resist flowing between a substrate and device with a low stand-off height.

One way to increase the stand-off height to allow for stronger solder joints is to attach solder balls to the exposed leads on the bottom surface of the device, e.g., a ball grid array (BGA). However, having to form the BGA adds time and expense to the packaging process. Further, solder balls can sometimes be dislodged prior to the device being soldered to a PCB due to mishandling. Thus, it would be advantageous to be able to increase the stand-off height for QFN or similar type packages without increasing the cost of production.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is an enlarged side view of a conventional QFN device attached to a substrate or Printed Circuit Board;

FIG. 2 is an enlarged side view of a QFN device, assembled in accordance with a method of the present invention, attached to a PCB;

FIG. 3 is a diagram illustrating the steps in assembling a QFN device in accordance with an embodiment of the present invention;

DETAILED DESCRIPTION OF THE INVENTION

Figure 4:
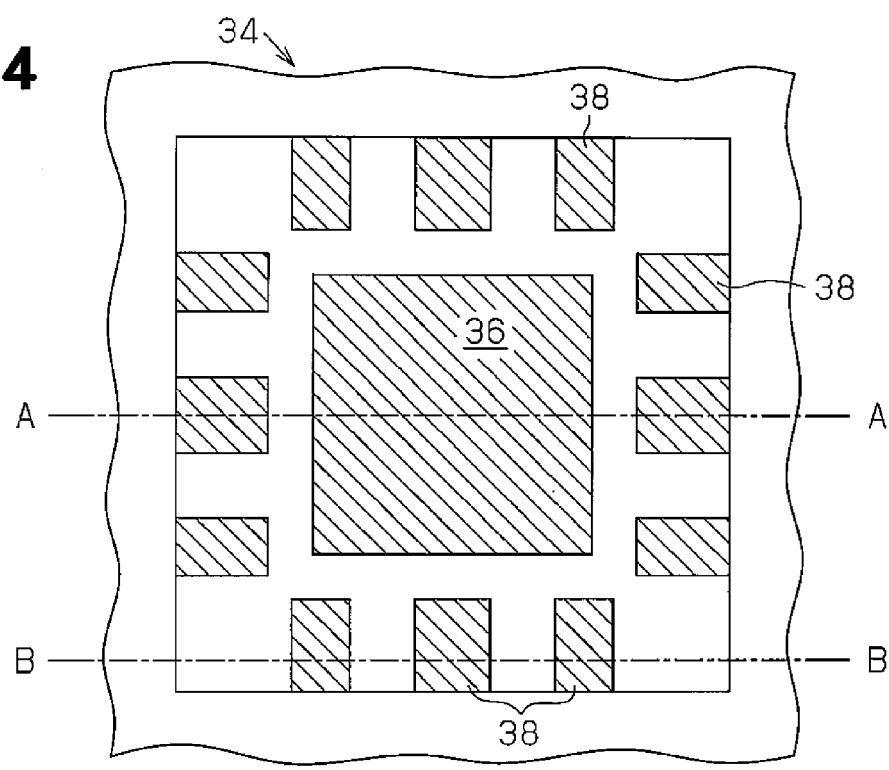
FIG. 4 is a bottom plan view of a QFN device assembled in accordance with the steps shown in FIG. 3.

The present invention is directed to an over all process for assembling an electronic device that has an improved stand-off height so that solder joints (electrical connections) between the device and a substrate or PCB are strong and reliable. As some of the steps and materials are well known, they will not be described in any more detail then necessary so as to not obfuscate or distract from the teachings of the present invention. For example, the semiconductor die described herein can be any semiconductor material or combinations of materials, such as gallium arsenide, silicon germanium, silicon-on-insulator (SOI), silicon, monocrystalline silicon, the like, and combinations of the above.

In addition, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Moreover, unless stated otherwise, terms such as "first" and "second" are used to arbitrarily distinguish between the elements such terms describe. Thus, these terms are not necessarily intended to indicate temporal or other prioritization of such elements.

Further, terms defined using "a" or "an," are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

In one embodiment, the present invention provides a method for packaging a semiconductor die, including the steps of:

attaching a first side of the die to a first side of a flag of a lead frame and taping a second side of the lead frame;

electrically connecting bonding pads on a second side of the die opposite to the first side of the die to leads of the lead frame with wires;

encapsulating at least the second side of the die, the wires, and the first side of the lead frame with a mold compound via a molding process, wherein the molding process includes placing the taped lead frame into a first part of a mold chase that has first protrusions on a surface thereof, said first protrusions arranged to project between the leads of the lead frame; and removing the tape from the second side of the lead frame.

In another embodiment, the present invention provides a method for packaging a semiconductor die, including the steps of:

attaching a first side of the die to a first side of a flag of a lead frame and taping a second side of the lead frame;

electrically connecting bonding pads on a second side of the die opposite to the first side of the die to leads of the lead frame with wires;

encapsulating at least the second side of the die, the wires, and the first side of the lead frame with a mold compound via a molding process, wherein the molding process includes placing the taped lead frame into a first part of a mold chase that has first protrusions on a surface thereof, said first protrusions arranged to project between the leads of the lead frame, and curing the mold compound;

removing the tape from the second side of the lead frame; and performing a singulation operation to separate the lead frame from any adjacent lead frames.

Referring now to FIG. 2, a semiconductor package 20, formed in accordance with a method of the present invention, attached to a PCB 22 is shown. The semiconductor package 20 includes a die electrically connected to a lead frame, with the die and lead frame at least partially encapsulated with a mold compound 24. In the embodiment shown, the package 20 is a QFN type package attached to the PCB 22 via reflow soldering. Exposed leads 26 of the package 20 are connected to corresponding connection points on the PCB 22, at solder joints 28. The package 20 has a low stand-off height. However, as shown in FIG. 2, the package 20 has indentations 30 along a bottom surface thereof between adjacent ones of the leads 26. Thus, although there is a low stand-off height between the package 20 and the PCB 12, there is sufficient space between the leads 26 to form strong solder joints. There also is sufficient space between the leads 26 to allow an underfill material to be injected between the package 20 and the PCB 22.

Referring now to FIG. 3, a method for packaging a semiconductor die in accordance with an embodiment of the present invention is shown. Starting from the top of the illustration, a semiconductor die 32 is attached to a lead frame 34. The lead frame includes a flag 36 and a plurality of leads 38. More specifically, a first side of the die 32 is attached to a first side of the flag 36 of the lead frame 34. Both the die 32 and the lead frame 34 are known in the art. The die 32 may be attached to the flag 36 with an adhesive, such as an epoxy or metal based die attach material, which is generally commercially available. In the next illustrated step, a tape 40 is attached to a second side of the lead frame 34. The tape 40 may be a pressure sensitive adhesive tape or a thermally fused adhesive tape, both of which are known in the art. The tape 40 is used to help prevent resin bleeding during molding.

The next illustrated step includes electrically connecting bonding pads on a second side of the die 32, opposite to the first side of the die, to the leads 38 of the lead frame 34 with wires 42. These electrical connections may be made using commercially available wire bonding machines. The wires 42 are made from a conductive metal, such as gold or copper.

After the wire bonding step, the die 32 and the taped lead frame 34 are placed in a mold chase (not shown) and encapsulated with a mold compound 44. The mold chase includes two parts. The taped lead frame 34 is placed into a first part of the mold chase. The first part of the mold chase has first protrusions arranged on a surface thereof such that the first protrusions project between the leads 38 of the lead frame 34. In one embodiment of the invention, the first part of the mold chase also includes second protrusions on a surface thereof that are arranged to project between the flag 36 and the leads 38. The second protrusions cause indentations 46 to be formed between the flag 36 and the leads 38. The mold compound 44 may comprise a plastic or resin material, as is known in the art. The mold compound 44 covers at least the second side of the die 32, the wires 42, and the first side of the lead frame 34.

In the last illustrated step, the tape 40 is removed from the second side of the lead frame 34, which exposes the second side of the leads 38. The tape 40 may be removed either manually or automatically with a commercially available detaping machine. In one embodiment of the invention, the mold compound 44 is cured prior to removal of the tape 40. In this manner, a QFN type package 48 that allows for improved stand-off is formed.

If an array of leads frames is used so that a plurality of packages may be formed simultaneously, as is known in the art, a singulation operation may be performed either before or after the tape is removed from the array of lead frames. The singulation operation separates the lead frames from any adjacent lead frames.

Referring now to FIG. 4, an example of the lead frame 34 is shown, which includes the flag 36 and leads 38 that surround the flag 36. The lead frame 34 may be formed by cutting or stamping a sheet of copper foil, as is know in the art.

Figure 5A:
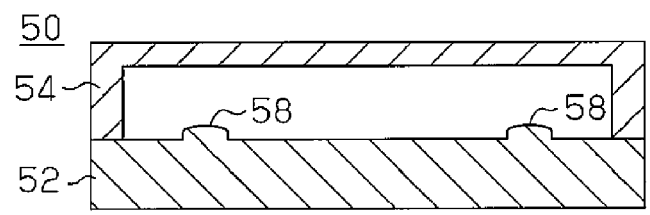
FIGS. 5A and 5B are cross-sectional views of the mold chase taken along lines A-A and B-B respectively, of FIG. 4.
Figure 5B:
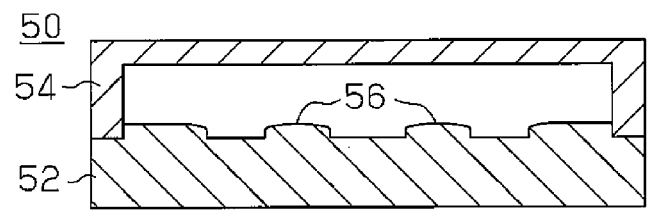
Figure 5C:
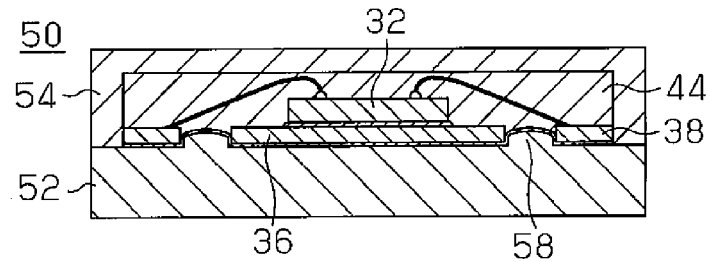
FIG. 5C is an illustration of a semiconductor die attached and electrically connected to a substrate inside a mold chase, in accordance with an embodiment of the present invention.

FIG. 5A shows a cross-sectional view of a mold chase 50, which includes a first or lower mold chase 52 and a second or upper mold chase 54. The cross-section of the mold chase 50 shown is taken as if along line A-A of the lead frame 34 shown in FIG. 4. Thus, two of the second projections 58 that are arranged between the flag 36 and the leads 38 are shown. FIG. 5B shows a cross-sectional view of the mold chase 50 as if taken along line B-B of the lead frame 34 shown in FIG. 4. Thus, first projections 56 are shown, which are arranged between the leads 38 of the lead frame 34. FIG. 5C shows the mold chase 50 with the die 32, lead frame 34 including the flag 36 and leads 38, tape 40, wires 42, and mold compound 44. FIG. 5C also shows the second projections 58 arranged between the flag 36 and the leads 38.

By now it should be appreciated that there has been provided an electronic device (packaged semiconductor die) that has a low profile yet may be readily soldered to a substrate or PCB. Although the invention is described herein with reference to specific embodiments, various modifications and changes can be made without departing from the scope of the present invention as set forth in the claims below, and the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method for packaging a semiconductor die, the method comprising:

attaching a first side of the die to a first side of a flag of a lead frame;

taping a second side of the lead frame;

electrically connecting bonding pads on a second side of the die opposite to the first side of the die to leads of the lead frame with wires;

encapsulating at least the second side of the die, the wires, and the first side of the lead frame with a mold compound via a molding process, wherein the molding process includes placing the taped lead frame into a first part of a mold chase that has first protrusions on a surface thereof, said first protrusions arranged to project between the leads and the flag of the lead frame; and removing the tape from the second side of the lead frame, whereby a semiconductor package that is formed has indentations between the leads and the flag.

2. The method for packaging a semiconductor die of claim 1, wherein the first part of the mold chase includes second protrusions on a surface thereof that are arranged to project between adjacent ones of the leads.

3. The method for packaging a semiconductor die of claim 1, further comprising a step of curing the mold compound prior to removing the tape.

4. The method for packaging a semiconductor die of claim 3, further comprising the step of performing a singulation operation to separate the lead frame from any adjacent lead frames.

5. The method for packaging a semiconductor die of claim 1, wherein the die is attached to the flag of the lead frame with an adhesive.

6. The method for packaging a semiconductor die of claim 5, wherein the die bond pads are electrically connected to the leads via wire bonding.

7. A method for packaging a semiconductor die, the method comprising:

attaching a first side of the die to a first side of a flag of a lead frame;

taping a second side of the lead frame;

electrically connecting bonding pads on a second side of the die opposite to the first side of the die to leads of the lead frame with wires;

encapsulating at least the second side of the die, the wires, and the first side of the lead frame with a mold compound via a molding process, wherein the molding process includes placing the taped lead frame into a first part of a mold chase that has first protrusions on a surface thereof, said first protrusions arranged to project between the leads and the flag of the lead frame;

curing the mold compound;

removing the tape from the second side of the lead frame thereby exposing the second sides of the leads; and performing a singulation operation to separate the lead frame from any adjacent lead frames, whereby a semiconductor package that is formed has indentations between the leads and the flag.

8. The method for packaging a semiconductor die of claim 7, wherein the first part of the mold chase includes second protrusions on a surface thereof that are arranged to project between adjacent ones of the leads.

9. The method for packaging a semiconductor die of claim 8, wherein the die is attached to the flag of the lead frame with an adhesive.

10. The method for packaging a semiconductor die of claim 9, wherein the die bond pads are electrically connected to the leads via wire bonding.

* * * * *